(12) United States Patent
Lee

(10) Patent No.: US 7,714,617 B2
(45) Date of Patent: May 11, 2010

(54) SIGNAL DRIVER CIRCUIT HAVING AN ADJUSTABLE OUTPUT VOLTAGE

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/209,051

(22) Filed: Sep. 11, 2008

(65) Prior Publication Data

US 2010/0060320 A1    Mar. 11, 2010

(51) Int. Cl.
*H03K 19/094* (2006.01)
(52) U.S. Cl. .......................................... 326/83; 326/27
(58) Field of Classification Search .................. 326/21, 326/26, 27, 82–87
See application file for complete search history.

(56) References Cited

U.S. PATENT DOCUMENTS

| | | | | |
|---|---|---|---|---|
| 5,160,855 | A | 11/1992 | Dobberpuhl | 307/270 |
| 5,426,383 | A | 6/1995 | Kumar | 326/119 |
| 5,453,705 | A | 9/1995 | Atallah et al. | 326/86 |
| 5,760,620 | A | 6/1998 | Doluca | 327/112 |
| 6,407,601 | B1 | 6/2002 | Lin | 327/158 |
| 6,496,036 | B2 * | 12/2002 | Kan | 326/58 |
| 6,570,415 | B2 | 5/2003 | Chen et al. | 327/108 |
| 6,614,268 | B2 | 9/2003 | Dally et al. | 327/51 |
| 6,803,793 | B2 | 10/2004 | Inoue | 326/95 |
| 7,026,854 | B2 | 4/2006 | Dake et al. | 327/309 |
| 7,365,571 | B2 | 4/2008 | Seo et al. | 326/83 |
| 2005/0052201 | A1 | 3/2005 | Bernard et al. | 326/82 |

OTHER PUBLICATIONS

A. Rjoub and O. Koufopavlou, "Low-Swing/Low Power Driver Architecture", Sep. 5-8, 1999 IEEE, pp. 639-642.

* cited by examiner

*Primary Examiner*—Don P Le
(74) *Attorney, Agent, or Firm*—Dorsey & Whitney LLP

(57) ABSTRACT

Processor-based systems, memories, signal driver circuits, and methods of generating an output signal are disclosed. One such signal driver circuit includes a signal driver configured to generate an output signal at an output node in response to an input signal and a transistor coupled to the signal driver that is configured to couple and decouple the output node and the voltage supply according to a control signal. A voltage comparator circuit coupled to the output node and the transistor is configured to generate the control signal to control coupling and decoupling of the output node and the voltage supply through the transistor based on a voltage of the output signal relative to the reference voltage.

32 Claims, 8 Drawing Sheets

SIGNAL DRIVER CIRCUIT HAVING AN ADJUSTABLE OUTPUT VOLTAGE

TECHNICAL FIELD

Embodiments of the invention relate generally to signal driver circuitry, and more specifically, in one or more of the illustrated embodiments, to signal driver circuits generating high-logic level output signals having a voltage less than a supply voltage.

BACKGROUND OF THE INVENTION

Many of today's electronic systems are portable and provide users with mobility and ease of transport. Laptops, cellular phones, digital cameras, portable gaming systems, handheld GPS receivers, are just a few examples of portable electronic systems. All of these systems have become increasingly lighter and smaller in form factor, while at the same time, however, these systems have ever greater performance than their predecessors. The increased performance typically has come at the expense of greater power consumption. Since these systems rely on battery power, system designers make an effort to design systems for low power consumption so that the systems can be operated for a greater length of time before replacing or recharging the battery.

As part of the effort to design lower power electronic systems, system designers build these systems to utilize components and circuitry that operate with lower power consumption. An example is to include a memory system that has low power consumption since today's electronic systems nearly universally include memory systems for storing data that are used during operation. The tradeoff between operating at lower power while maintaining or improving performance is a difficult one since greater memory capacity or improved speed typically come at the cost of additional circuitry, which translates into additional power consumption. As a result, memory system designers are continually looking for creative solutions to improve power consumption, but at the same time, without compromising performance.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1A:
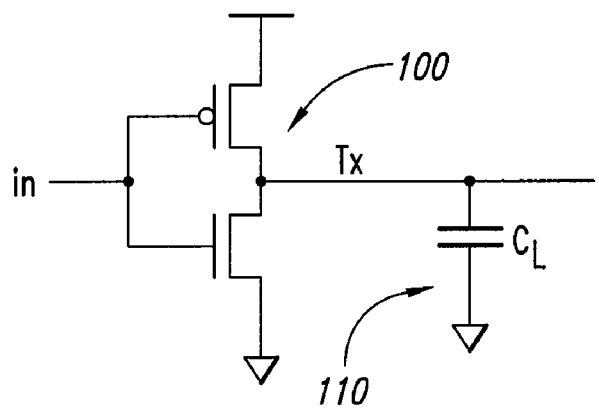
FIG. 1A is schematic drawing of a conventional signal driver coupled to an output load.
Figure 1B:
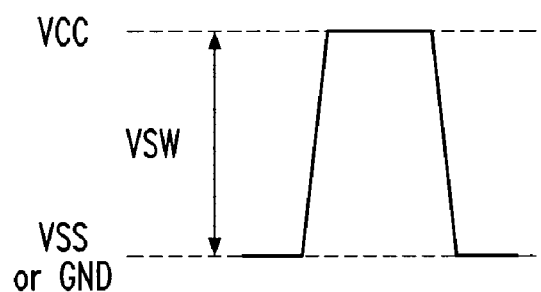
FIG. 1B is a signal diagram of an example output signal of the conventional signal driver of FIG. 1B.

FIG. 1A illustrates a conventional signal driver circuit for driving an output signal Tx having a logic level based on the input signal "in." The signal driver circuit includes a complementary metal-oxide semiconductor ("CMOS") inverter 100 coupled between a supply voltage Vcc and ground. FIG. 1A further illustrates a capacitor 110, which represents the capacitive load driven by the signal driver circuit. In operation, the CMOS inverter 100 drives an output signal having a high-logic level in response to a low-logic level in signal and drives an output signal having a low-logic level in response to a high-logic level in signal. With reference to FIG. 1B, the voltage of the high-logic level is Vcc, that is, the supply voltage, and the voltage of the low-logic level is ground (i.e., 0 V). As known, dynamic power consumption of the CMOS inverter 100 can be calculated using the equation:

$$P = C \times Vcc^2 \times f,$$

where C is the equivalent capacitance for the circuit, Vcc is the supply voltage, and f is the switching frequency of the input signal. As will be discussed in more detail below, embodiments of the invention provide a signal driver circuit that has lower power consumption compared to the signal driver circuit of FIG. 1A.

Signal driver circuits having reduced power consumption relative to signal driver circuits such as that shown in FIG. 1 are described in U.S. patent application Ser. No. 12/101,770, filed Apr. 11, 2008 and entitled SIGNAL DRIVER CIRCUIT HAVING ADJUSTABLE OUTPUT VOLTAGE FOR A HIGH LOGIC OUTPUT SIGNAL, which is incorporated herein by reference in its entirety.

Figure 2A:
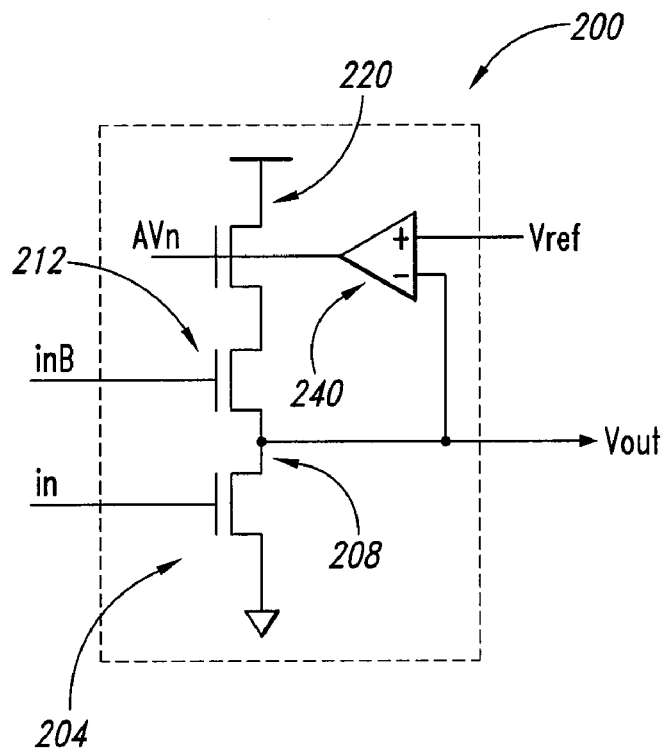
FIG. 2A is a schematic drawing of a signal driver circuit according to an embodiment of the invention.

FIG. 2A illustrates an signal driver circuit 200 according to an embodiment of the invention. The signal driver circuit 200 includes a first transistor 204 having a drain coupled to an output node 208 and a source coupled to a reference node, such as ground. The signal driver circuit 200 further includes and a second transistor 212 having a source coupled to the output node 208. An input signal "in" is applied to a gate of the first transistor 204 and a complementary input signal "in B" is applied to a gate of the second transistor 212. Conventional circuitry and techniques known to those ordinarily skilled in the art can be used to generate the complementary input signal in B. The transistor 204 acts as a pull-down transistor to pull the output node 208 down to the reference node (e.g., ground) when activated and the transistor 212 acts as a pull-up transistor to pull up the output node 208 to a VHigh voltage when activated. The transistors 204 and 212 function as switches to couple and decouple the output node 208 according to the in and in B signals. An output signal Vout is provided at the output node 208 having a logic level in accordance with the logic level of the in (and in B) signal. A third transistor 220 is coupled to a supply voltage, such as Vcc, and the drain of the second transistor 212. A gate of the transistor 220 is coupled to the output of a voltage comparator circuit 240 having a first input coupled to the output node 208 and a second input coupled to receive a voltage reference signal Vref. The transistor 220 is controlled by a control voltage AVn generated by the voltage comparator circuit 240 in response to a comparison of the Vout voltage and the Vref voltage. In the embodiment of the invention illustrated in FIG. 2A, the transistors 204, 208, 212 are n-channel transistors, for example, n-channel metal-oxide semiconductor ("NMOS") transistors. In other embodiments, the transistors 204, 212, 220 can be other types of transistors as well.

Figure 2B:
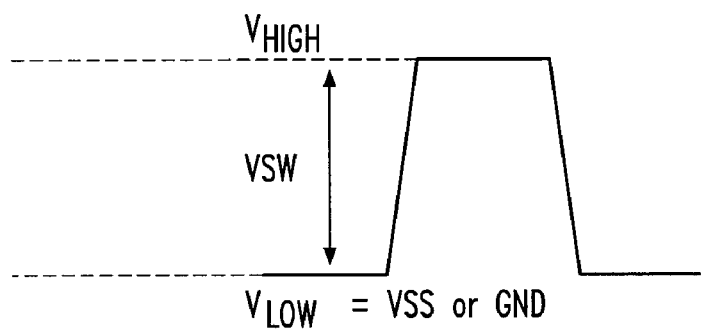
FIG. 2B is a signal diagram of an example output signal of the signal driver circuit of FIG. 2B.

As will be described in more detail below, the transistor 220 and voltage comparator circuit 240 provide a switch circuit that and are used to set the voltage VHigh of a high-logic level of the Vout signal, and consequently, set the swing voltage Vsw of the signal driver circuit 200. That is, the Vout signals generated by the signal driver circuit 200 will have a Vsw between VLow and VHigh, as shown in FIG. 2B. Where VLow is ground (i.e., 0 V), Vsw is equal to VHigh.

Setting the VHigh voltage less than the Vcc can reduce dynamic power consumption of signal driver circuitry. As previously discussed, the dynamic power consumption of a conventional CMOS inverter signal driver, such as that shown in FIG. 1B, can be calculated using the equation:

$P = C \times Vcc_2 \times f,$ where C is the equivalent capacitance for the circuit, Vcc is the supply voltage, and f is the switching frequency of the input signal. In contrast, the power for the signal driver circuit 200 can be calculated using the following equation:

$P = C \times Vcc \times Vsw \times f,$ where C is the equivalent capacitance for the circuit, Vcc is the supply voltage, Vsw is the swing voltage, and f is the switching frequency of the input signal. Setting the VHigh voltage to less than Vcc reduces the Vsw voltage of the signal driver circuit 200 compared to the Vsw of the signal driver circuit 100. That is, in embodiments of the invention where Vsw is less than Vcc (i.e., the swing voltage for the signal driver circuit 100), the power consumption is less than the power consumption of signal driver circuits such as signal driver circuit 100. Put another way, $(C \times Vcc \times Vswf) < (C \times Vccxf)$, because Vsw<Vcc.

In operation, the signal driver circuit 200 generates an output signal Vout at the output node 208 in accordance with the logic level of the in (and inB) signal. When generating a high-logic level output signal in response to a low-logic level in signal, the signal driver circuit 200 provides a high-logic level having a VHigh voltage.

Figure 3A:
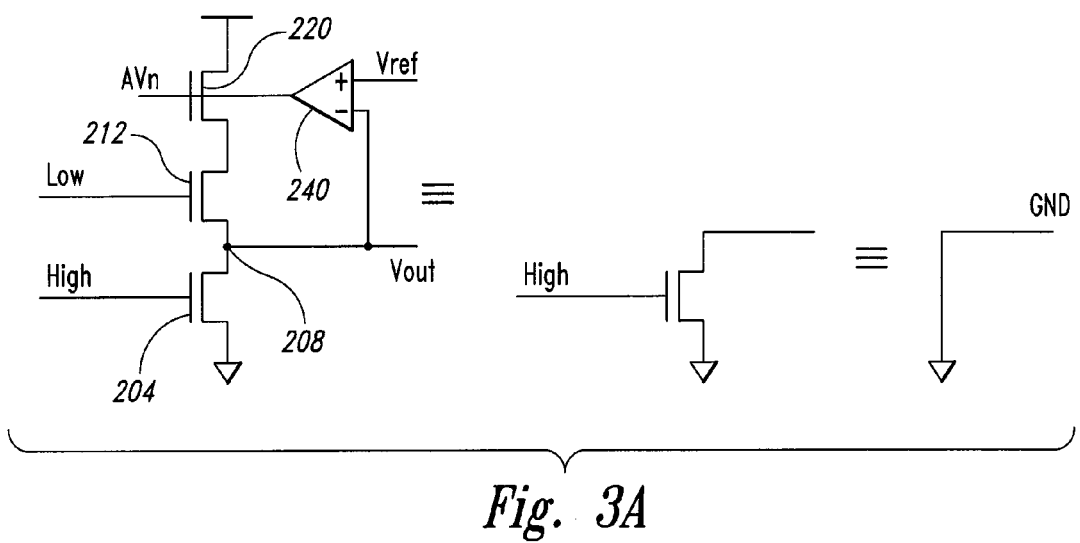
FIG. 3A is a diagram of an equivalent circuit of the signal driver circuit of FIG. 2A for an input having a high-logic level.

FIG. 3A illustrates an equivalent circuit for the signal driver circuit 200 in response to receiving an in signal having a high-logic level (inB is low). As shown, the transistor 204 is conductive due to the high in signal and the transistor 212 is not conductive due to the low inB signal. As a result, the equivalent circuit is the output node 208 coupled to the reference node, shown in FIG. 2A as ground. Thus, for a high in signal, the signal driver circuit 200 generates a low output signal at the output node 208.

Figure 3B:
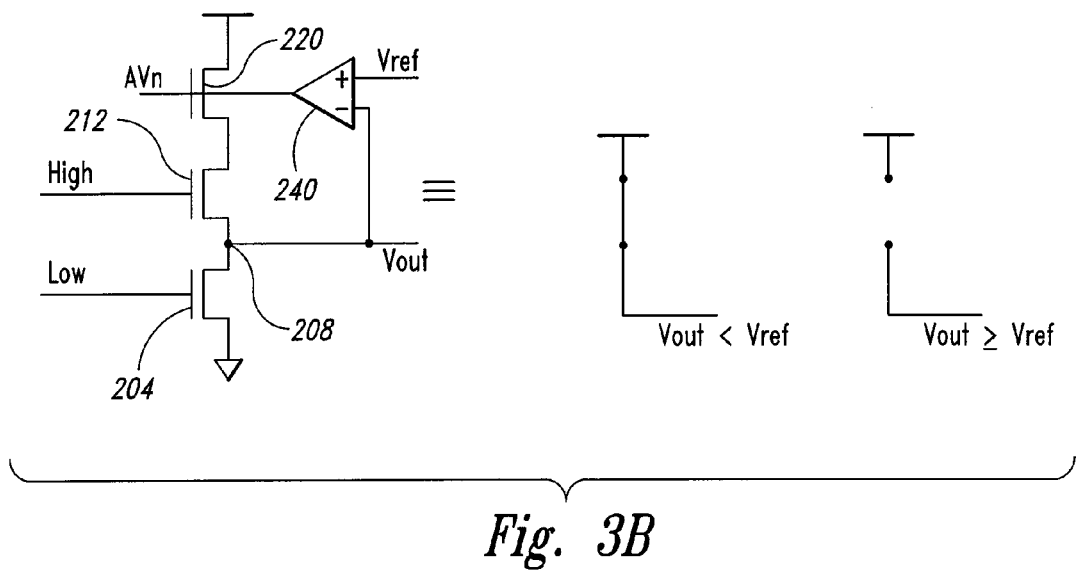
FIG. 3B is a diagram of an equivalent circuit of the signal driver circuit of FIG. 2A for an input signal having a low-logic level.

FIG. 3B illustrates an equivalent circuit for the signal driver circuit 200 in response to receiving an in signal having a low-logic level (inB is high). The transistor 204 is not conductive due to the low in signal and the transistor 212 is conductive due to the high inB signal. As a result, the output node 208 coupled to the source of the transistor 220. As previously discussed, the transistor 220 and the voltage comparator circuit 240 are used to set the VHigh voltage (the voltage of a high-logic level of the output signal). When the Vout voltage is less than the Vref voltage, the AVn voltage output by the voltage comparator circuit 240 is at AVnHigh voltage to control the transistor 220 to be conductive, resulting in an equivalent circuit of having the output node 208 coupled to the supply voltage, as shown in FIG. 3B. The Vout voltage increases due to the coupling of the output node 208 to the supply voltage until the Vout voltage reaches the Vref voltage, at which point, the voltage comparator circuit 240 generates an AVn voltage having the AVnLow voltage that controls the transistor 220 to no longer be conductive. As a result, when the Vout voltage reaches the Vref voltage the output node 208 is decoupled from the supply voltage, as shown by the equivalent circuit of FIG. 3B. The Vref voltage can be used to control the maximum voltage of the Vout voltage, that is, the VHigh voltage.

Figure 2C:
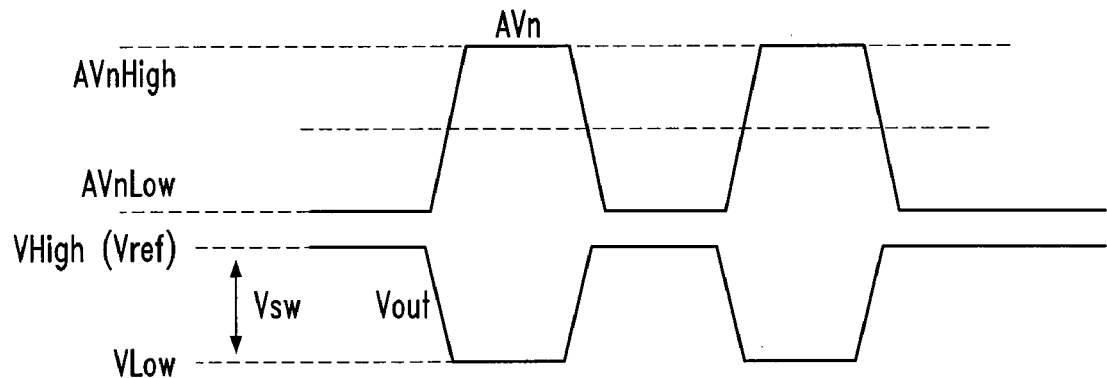
FIG. 2C is a signal diagram of the output signal of the signal driver circuit and a control voltage according to an embodiment of the invention.

The voltage comparator circuit 240 generates an AVn voltage to control the transistor 220 that is generally inversely-related to the Vout voltage relative to the Vref voltage, as shown in the signal diagram of FIG. 2C. That is, when the Vout voltage is low, the AVn voltage is high and when the Vout voltage is high, the AVn voltage is low. The Vref voltage can be used to set the VHigh (Vsw) of the signal driver circuit 200. For example, as the Vout voltage increases to be equal to the VHigh (Vref) voltage (i.e., when the in signal is low), the voltage comparator circuit 240 generates the AVn voltage to have a voltage AVnLow. The transistor 220 becomes non-conductive and decouples the output node 208 from the supply voltage as a result.

The voltage comparator circuit 240 provides an AVnLow voltage to inhibit sub-threshold voltage currents through the transistor 220 when the transistor 220 is non-conductive. Sub-threshold currents may cause overdriving of a high-logic level Vout signal to voltages greater than a desired VHigh voltage, which can reduce the amount of time output data is considered valid and reduce timing margin for a circuit receiving the output data signal. In some embodiments, the AVn voltage range can be from ground to the supply voltage. In other embodiments, the AVnLow voltage range is greater than ground. In some embodiments, the AVnHigh voltage is greater than the supply voltage. In other embodiments, the AVnHigh voltage is less than the supply voltage. Generally, AVnHigh should be greater than the sum of the desired Vsw and the threshold voltage of the transistor 220 and AVnLow should be less than the same sum.

As the output node 208 is floating, the Vout voltage is sustained for a finite period of time. As known, due to parasitic current leakage, the Vout voltage eventually decreases. However, as input data is provided to the input node of the signal driver circuit 200, the signal driver circuit 200 typically transitions between driving high- and low-logic signals and does not generally continuously drive a high-logic level output signal. Additionally, the comparator generates an AVn voltage to recouple the output node 208 (the AVn voltage equals the AVnHigh) to the supply voltage when the Vout voltage decreases to less than the Vref voltage. As a result, the Vout voltage is maintained at VHigh. When the Vout voltage is at the VLow voltage (i.e., the in signal is high), the AVn voltage controls the transistor 220 to be conductive. However, the output node 208 continues to be de-coupled from the supply voltage because the transistor 212 remains non-conductive due to the low-logic level inB signal.

Setting the VHigh voltage of a high-logic level less than the full supply voltage, such as Vcc, provides advantages in terms of lower power consumption compared to a conventional signal driver circuit providing a high-logic level of Vcc, as previously discussed. Another advantage to having VHigh less than Vcc may be faster transition times between high and low-logic levels because the swing voltage Vsw between the high and low-logic levels is less than for transitions to and from Vcc. That is, the lower VHigh level will generally take less time to be reached when transitioning from a low-logic level (e.g., ground).

As will be described in more detail below, in some embodiments of the invention the Vref voltage is equal to the desired swing voltage Vsw. In some other embodiments of the invention, the Vref voltage is greater than Vsw, for example, Vsw+Vthn, where Vthn is a transistor threshold voltage. Generally, the Vref signal can be tailored to set a desired VHigh (Vsw) voltage.

Figure 2D:
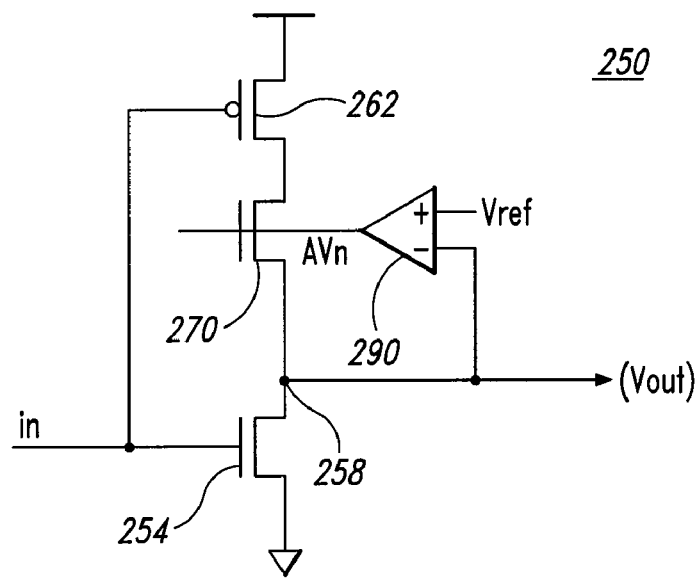
FIG. 2D is a schematic drawing of a signal driver circuit according to another embodiment of the invention.

FIG. 2D illustrates a signal driver circuit 250 according to another embodiment of the invention. The signal driver circuit 250 includes a first transistor 254 having a drain coupled to an output node 258 and a source coupled to a reference node, such as ground. The signal driver circuit 250 further includes and a second transistor 262 having a source coupled to the supply voltage and a drain coupled to a third transistor 270 having a source coupled the output node 258. A gate of the third transistor 270 is coupled to an output of a voltage comparator circuit 290 that compares a reference voltage Vref and the voltage of the output node 258. An input signal in is applied to gates of the first and second transistors 254 and 262, which act as pull-down and pull-up transistors, respectively. In comparison to the signal driver circuit 200 shown in FIG. 2A, an inB signal complementary to the in signal is not necessary for operation of the signal driver circuit 250.

Ignoring operation of the voltage comparator circuit 290 and the third transistor 270 for the time being, the first transistor 254 couples the output node 258 to a reference voltage (e.g., ground) and the second transistor 262 decouples the output node 258 from the supply voltage in response to the in signal having a high-logic level. Conversely, the second transistor 262 couples the output node 258 to the supply voltage and the second transistor 254 decouples the output node 258 from the reference voltage in response to the in signal having a low-logic level.

The voltage comparator 290 and the third transistor 270 provide a switch circuit and are used to set a high-logic level voltage VHigh of the Vout voltage to less than the supply voltage, thus, limiting the swing voltage Vsw. In particular, the voltage comparator 290 generates a control voltage AVn that controls the third transistor 270 to be conductive when the Vout voltage is less than the Vref voltage and controls the third transistor 270 to be non-conductive when the Vout voltage reaches the Vref voltage. In this manner, as previously described with reference to the signal driver circuit 200, the output node 258 can be coupled and de-coupled from the supply voltage while the in signal is at a low-logic level (i.e., the second transistor 262 is conductive) to limit the VHigh voltage according to the Vref voltage.

As will be described in more detail below, the Vref voltage may be equal to a desired Vsw in some embodiments, and may be greater than a desired Vsw voltage (e.g., greater than Vsw by a transistor threshold voltage) in some other embodiments.

Figure 4A:
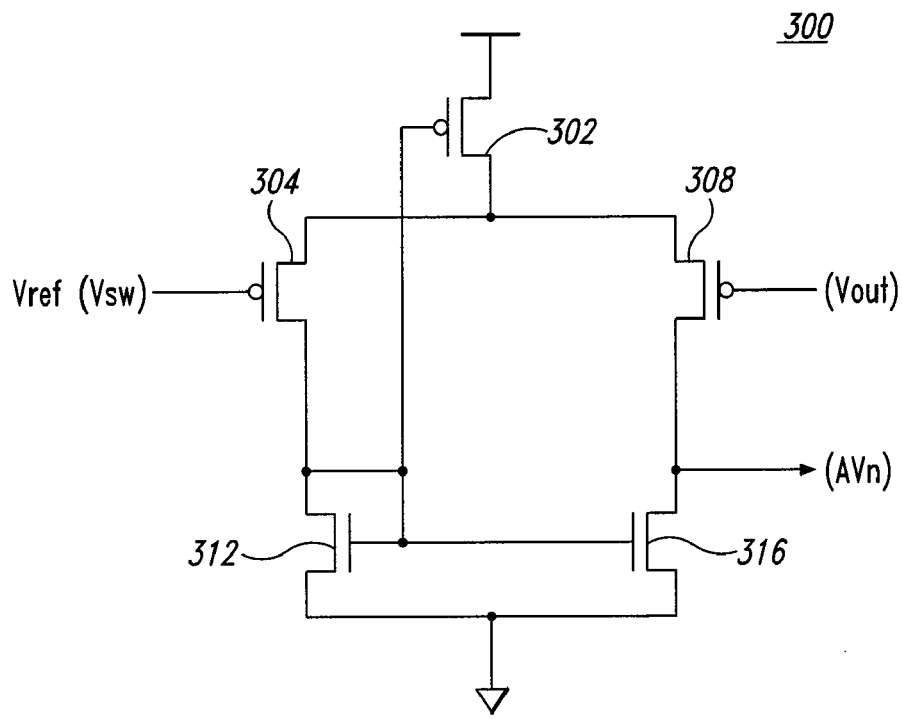
FIG. 4A is a schematic drawing of a voltage comparator circuit according to an embodiment of the invention for a signal driver circuit.

FIG. 4A illustrates a voltage comparator circuit 300 according to some embodiments of the invention. The voltage comparator circuit 300 can be used for the voltage comparator circuits 240 and 340 in the embodiments described with reference to FIGS. 2A and 2D. The voltage comparator circuit 300 is a differential pair amplifier. Transistors 304, 308 are coupled to a supply voltage through load transistor 302. Transistors 312, 316 are coupled to the transistors 304, 308 in a current mirror configuration. In operation, the AVn voltage is based on the Vout voltage relative to the Vref voltage. In embodiments of the invention using the voltage comparator circuit 300, the Vref voltage is equal to the desired swing voltage Vsw. The resulting AVn voltage can be used in setting the VHigh voltage of a high voltage level to Vsw.

Figure 4B:
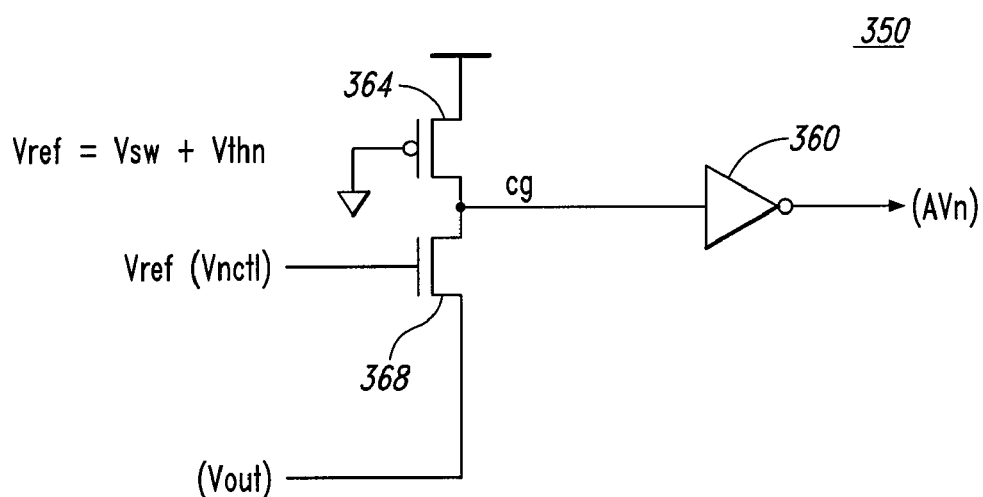
FIG. 4B is a schematic drawing of a voltage comparator circuit according to another embodiment of the invention for a signal driver circuit.

FIG. 4B illustrates a voltage comparator circuit 350 according to some embodiments of the invention. The voltage comparator circuit 350 can be used for the voltage comparator circuits 240 and 340 in the embodiments described with reference to FIGS. 2A and 2D. The voltage comparator circuit 350 is a common-gate amplifier having an output coupled to an inverter 360. Transistors 364, 368 are series coupled to a supply voltage. A source of the transistor 368 is coupled to receive the Vout voltage and a gate of the transistor 368 is coupled to receive the Vref voltage. A gate of the transistor 364 is coupled to ground to provide a load impedance. The inverter 360 is coupled to the transistors 364, 368 to provide the AVn voltage based on an output voltage cg. As a result, the AVn voltage is based on the Vout voltage relative to the Vref voltage. In embodiments of the invention using the voltage comparator circuit 350, the Vref voltage is equal to the sum of the desired VHigh voltage (or the desired swing voltage Vsw where VLow is ground) and the threshold voltage Vthn of the transistor 368. The resulting AVn voltage can be used in setting the VHigh voltage of a high-level voltage to Vsw, assuming the voltage of a low voltage level is ground.

In operation, when the Vout voltage is less than (Vref−Vthn), the transistor 368 is conductive and provides the Vout voltage as the cg voltage to the inverter 360. Under this condition, the AVn voltage has a voltage of AVnHigh. As the Vout voltage increases to Vsw, the transistor 368 becomes non-conductive because the gate-source voltage is less than Vthn, allowing the cg voltage to be pulled up by the supply voltage and load impedance of transistor 364. Under this condition, the inverter 360 provides an AVn voltage having a voltage of AVnLow. The AVn voltage remains at AVnLow until the Vout voltage decreases to less than Vsw (i.e., Vref−Vthn), at which time the transistor 368 becomes conductive and couples the input of the inverter 360 to receive the Vout voltage. The inverter 360 inverts the Vout voltage to provide an AVn voltage of AVnHigh under these conditions.

Figure 5:
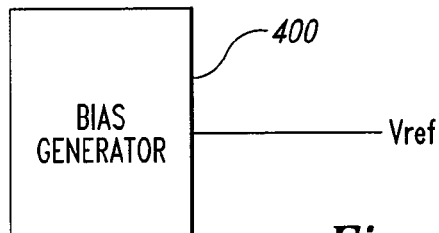
FIG. 5 is a block diagram of a bias voltage circuit according to an embodiment of the invention.

FIG. 5 illustrates a bias voltage generator 400 according to an embodiment of the invention. The bias voltage generator 400 can be used to provide a Vref voltage to one or more signal driver circuits, such as the signal driver circuits 200 and 250. The bias voltage generator 400 provides a Vref voltage to the voltage comparator for setting the VHigh voltage of the Vout voltage, as previously described.

Figure 6A:
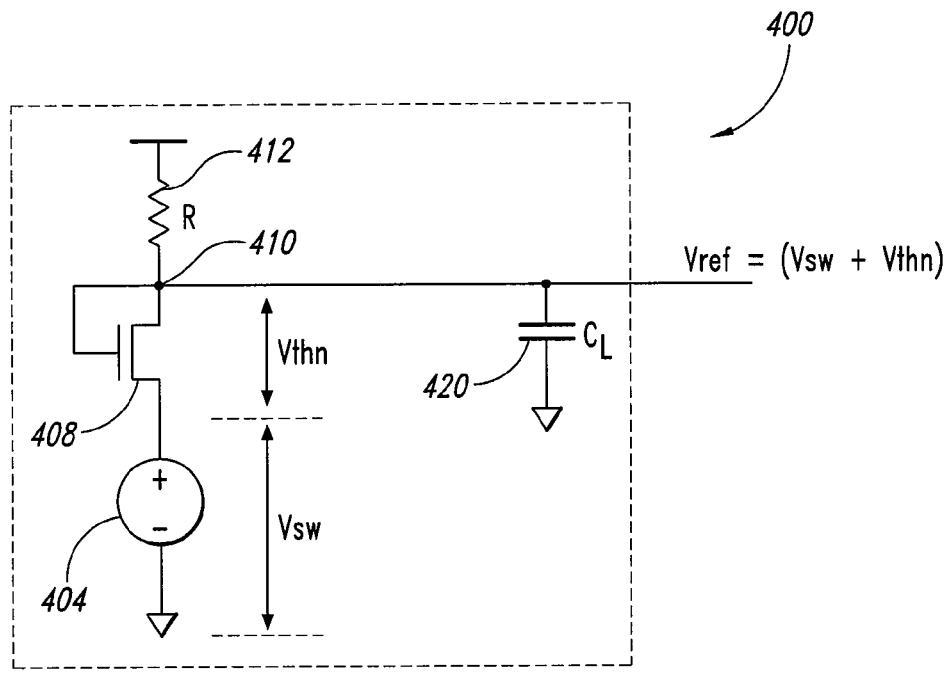
FIG. 6A is a schematic drawing of a bias voltage circuit according to an embodiment of the invention.

FIG. 6A illustrates an embodiment of a bias voltage generator 400 for providing a Vref equal to (Vsw+Vthn). The bias voltage generator 400 includes a voltage supply 404 and a transistor 408 coupled between a bias voltage output 410 and a reference voltage, such as ground. The voltage supply 404 provides a constant voltage equal to the VHigh (Vsw) voltage. Conventional voltage supplies can be used for the voltage supply 404. As shown in FIG. 6A, where the VLow voltage is equal to zero (i.e., ground), the voltage supply 404 provides a constant voltage equal to the Vsw voltage, which is equal to the VHigh voltage under this condition. The transistor 408 is coupled as a diode between the bias voltage output 410 and the voltage supply 404 to provide a voltage approximately equal to Vthn of the transistor of the voltage comparator circuit to which the Vref voltage is applied. For example, with reference to the voltage comparator circuit 350 (FIG. 4B), the transistor 408 is diode-coupled to provide a voltage equal to the Vthn of the transistor 368. In some embodiments, the transistor 408 has similar transistor characteristics as the transistor to which the Vref voltage is applied. As a result, process variations during fabrication of the circuits and variations in operating conditions will be accommodated because the transistor characteristics for both the transistor 408 and the transistor to which the Vref voltage is applied will be influenced in the same manner. A resistive load 412 is coupled between a voltage supply, such as Vcc, and the bias voltage output 410. The resistive load 412 provides a weak pull-up current path for the bias voltage output 410. An optional capacitor 420 can be coupled to the bias voltage output 410 for filtering noise in the Vcc supply voltage or ground.

In operation, the bias voltage output 410 is set at the Vref voltage by the VHigh/Vsw voltage supply 404 and the diode coupled transistor 408. As previously discussed, the resulting Vref voltage is equal to (VHigh+Vthn). The resistor 412, which generally has a large resistive value, provides a sufficient voltage drop in Vcc so that the Vref voltage can be output. As previously discussed, the Vref voltage can be used to set the VHigh voltage of the signal driver circuit.

In an alternative embodiment of the bias voltage generator, the bias voltage output 410 of the bias voltage generator of FIG. 6A can be coupled to a buffering circuit (not shown), for example, an operational amplifier coupled as a unity gain buffer, to provide a stable Vref voltage having greater drive capability.

Figure 6B:
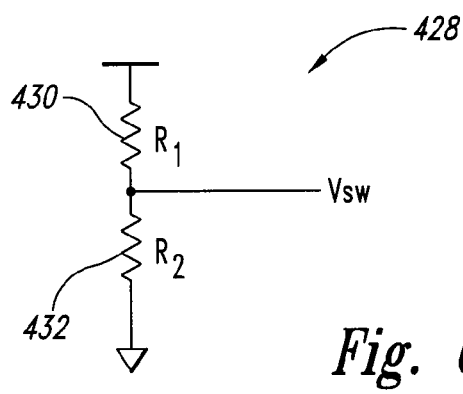
FIG. 6B is a schematic drawing of a voltage supply according to another embodiment of the invention.

In an embodiment of the invention, a Vsw voltage is provided using a voltage divider circuit 428. FIG. 6B illustrates an example of providing a Vsw voltage using a voltage divider circuit having resistance 430 and resistance 432 coupled in series between Vcc and ground. As known in the art, the ratios of the magnitude of the resistances 430 and 432 can be selected to provide a desired voltage, such as Vsw. Although the voltage supply 404 illustrated in FIG. 6B is shown having only two resistances, other embodiments can include a greater number of resistances. For example, where Vcc is equal to 1.2 V and the desired Vsw is equal to 0.4 V, three resistors having the same resistance can be coupled in series between Vcc and ground to provide the Vsw voltage. That is, a Vsw voltage of 0.4 V would be provided at the terminal of the resistor coupled to ground. In other embodiments of the invention, the Vsw voltage is provided using a conventional bandgap voltage source to provide the constant VHigh voltage. As known, a bandgap voltage source can provide a constant VHigh voltage even if the supply voltage fluctuates, for example, due to noise.

Other techniques for generating the Vref and Vsw voltages can be used in other embodiments, and consequently, the invention is not limited to a particular technique for generating the Vnctl voltage.

Figure 7:
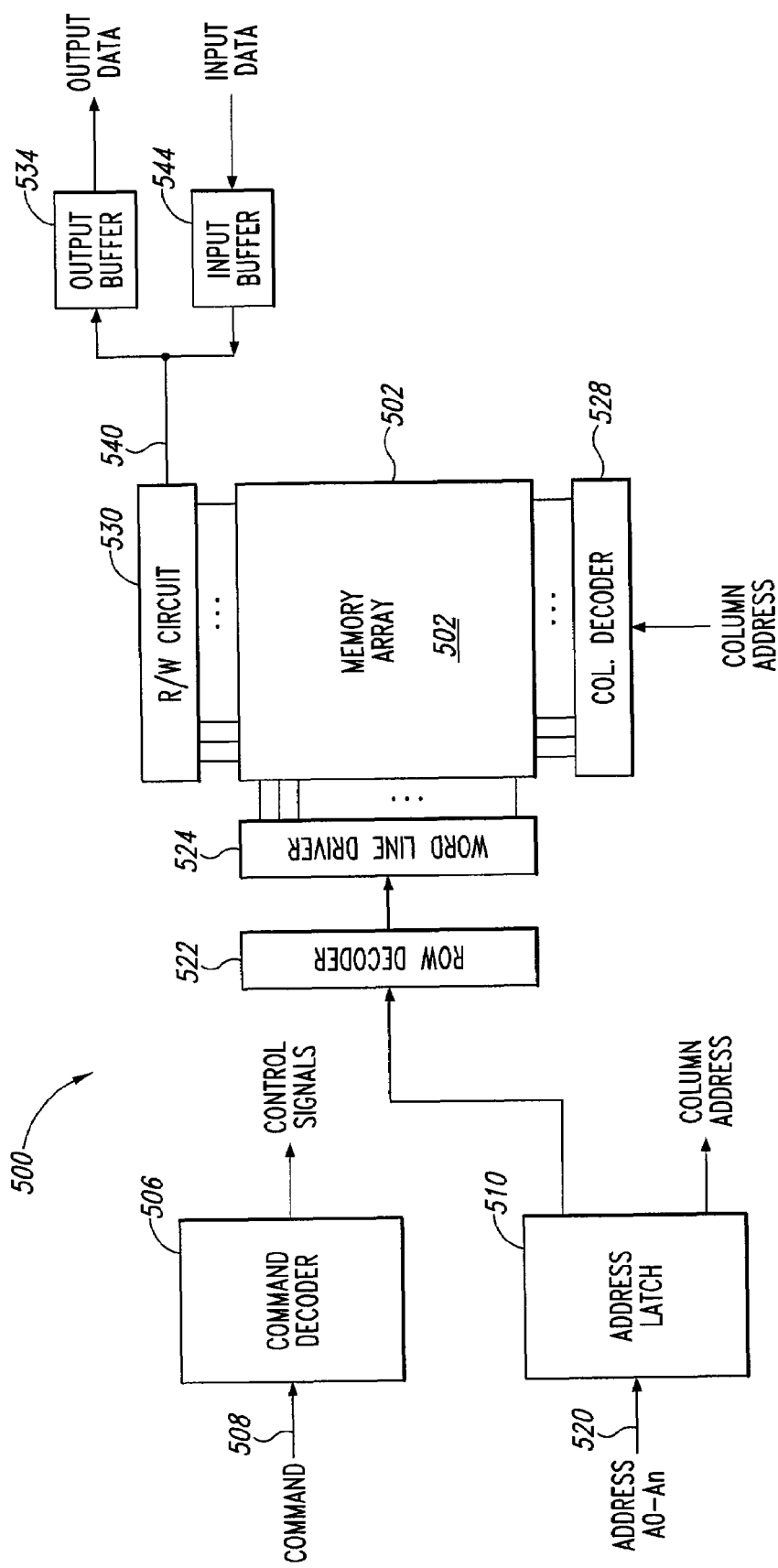
FIG. 7 is a block diagram of a memory system according to an embodiment of the invention using a signal driver circuit of FIG. 2A or 2D, or a signal driver circuit according to another embodiment of the invention.

FIG. 7 illustrates a portion of a memory 500 according to an embodiment of the invention. The memory 500 includes an array 502 of memory cells, which may be, for example, DRAM memory cells, SRAM memory cells, flash memory cells, or some other types of memory cells. The memory 500 includes a command decoder 506 that receives memory commands through a command bus 508 and generates corresponding control signals within the memory 500 to carry out various memory operations. Row and column address signals are applied to the memory 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

Signal driver circuits according to embodiments of the invention are included in the memory 500. In some embodiments of the memory 500, signal driver circuits are configured to drive internal or on-chip signals from one internal component to another, for example, driving the internal control signals from the command decoder 506 to other internal components of the memory 500. Other examples include driving internal address signals from the address decoders 522, 528, and driving internal data signals over the input-output bus 540. In other embodiments of the memory 500, signal driver circuits are configured to drive data signals external to the memory 500. For example, the output buffer 534 can include signal driver circuits configured to drive output data signals to circuits external the memory 500. Signal driver circuits may be utilized in other applications as well for other embodiments of the invention.

Figure 8:
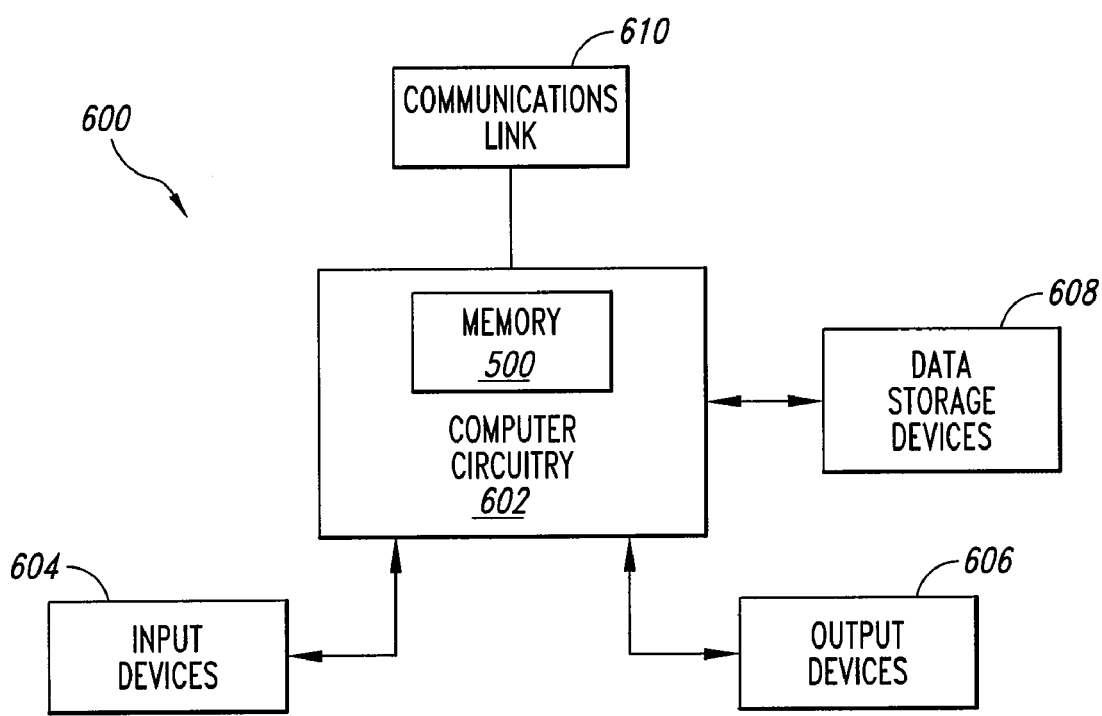
FIG. 8 is a block diagram of a processor-based system using the memory system of FIG. 7 or a memory system according to some other embodiment of the invention.

FIG. 8 is a block diagram of a processor-based system 600, including computer circuitry 602 that contains the memory 500 of FIG. 7 or a memory system according to some other embodiment of the invention. The computer circuitry 602 performs various computing functions, such as executing specific software to perform specific calculations or tasks. In addition, the processor-based system 600 includes one or more input devices 604, such as a keyboard, coupled to the computer circuitry 602 to allow an operator to interface with the processor-based system. Typically, the processor-based system 600 also includes one or more output devices 606 coupled to the computer circuitry 602, such output devices typically being a display device. One or more data storage devices 608 are also typically coupled to the computer circuitry 602 to store data or retrieve data. Examples of storage devices 608 include hard disks and non-volatile memory. The processor-based system 600 also includes a wireless communication link 610 through which the computer circuitry can send and receive data through a wireless medium. The computer circuitry 602 is typically coupled to the memory 500 through appropriate address, data, and control busses to provide for writing data to and reading data from the memory 500.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A signal driver circuit, comprising:
a signal driver configured to generate an output signal at an output node in response to an input signal;
a transistor coupled to the signal driver and configured to be coupled to a voltage supply, the transistor configured to couple and decouple the output node and the voltage supply according to a control signal; and
a voltage comparator circuit coupled to the output node and the transistor and configured to receive a reference voltage, the voltage comparator circuit configured to generate the control signal to control coupling and decoupling of the output node and the voltage supply through the transistor based on a voltage of the output signal relative to the reference voltage.

2. The signal driver circuit of claim 1 wherein the reference voltage is equal to a desired voltage for a high-logic level output signal.

3. The signal driver circuit of claim 1 wherein the control signal and the output signal have inversely-related voltages.

4. The signal driver circuit of claim 1 wherein the signal driver comprises first and second series coupled transistors and the transistor coupled to the signal driver comprises a transistor coupled between the voltage supply and the first transistor.

5. The signal driver circuit of claim 4 wherein the first and second series coupled transistors comprises first and second n-channel transistors.

6. The signal driver circuit of claim 1 wherein the signal driver comprises a complementary pair of transistors and the transistor coupled to the signal driver comprises a transistor coupled between the output node of the signal driver and a first transistor of the complementary pair, the first transistor further coupled to the voltage supply.

7. The signal driver circuit of claim 1 wherein the voltage comparator circuit comprises a differential pair amplifier.

8. The signal driver circuit of claim 7 wherein the differential pair amplifier comprises:
a load circuit coupled to the voltage supply;
a current mirror circuit having an input and an output;
a first transistor coupled to the load circuit and the input to the current mirror; and
a second transistor coupled to the load circuit and the output of the current mirror.

9. The signal driver circuit of claim 1 wherein the voltage comparator circuit comprises a common-gate amplifier having an output coupled to an inverter circuit.

10. The signal driver circuit of claim 9 wherein the common-gate amplifier comprises a load circuit coupled to the voltage supply and the output and a transistor coupled to the output node of the signal driver and the output of the common-gate amplifier.

11. A signal driver circuit having an output node, comprising:
a pull-down transistor coupled to the output node and a reference node, the pull-down transistor configured to electrically couple the output node to the reference node in response to an input signal having a first logic level and decouple the output node from the reference node in response to the input signal having a second logic level;
a pull-up transistor coupled to the output node and a voltage supply, the pull-up transistor configured to be conductive in response to the input signal having the second logic level and non-conductive in response to the input signal having a first logic level; and
a switch circuit coupled to the voltage supply and the output node, the switch configured to couple the voltage supply to the output voltage node when the in signal has the second logic level and responsive to a voltage of the output node relative to a reference voltage.

12. The signal driver circuit of claim 11 wherein the switch circuit comprises:
a transistor coupled to the output node and the voltage supply, the transistor configured to be conductive in response to a control signal; and
a voltage comparator circuit having a first input coupled to the output node, a second input configured to receive the reference voltage, and an output coupled to the transistor, the voltage comparator circuit configured to generate the control signal to control conductivity of the transistor in response to the voltage of the output node relative to the reference voltage.

13. The signal driver circuit of claim 12 wherein the voltage comparator comprises a voltage comparator configured to generate the control signal to control the transistor to be conductive in response to the voltage of the output node being less than the reference voltage and configured to generate the control signal to control the transistor to be non-conductive in response to the voltage of the output node being greater than the reference voltage.

14. The signal driver circuit of claim 11 wherein the pull-down transistor comprises a first n-channel transistor having a source coupled to ground and a drain coupled to the output node and the pull-up transistor comprises a second n-channel transistor having a source coupled to the output node and a drain coupled to the switch circuit.

15. The signal driver circuit of claim 11 wherein the pull-down transistor comprises an n-channel transistor having a source coupled to ground and a drain coupled to the output node and the pull up transistor comprises a p-channel transistor having a source coupled to the voltage supply and a drain coupled to the switch circuit.

16. The signal driver circuit of claim 11, further comprising a bias voltage generator coupled to the switch circuit and configured to generate the reference voltage.

17. The signal driver circuit of claim 16 wherein the bias voltage generator comprises:
a voltage supply configured to generate a voltage equal to a voltage for a high-logic level output signal from the signal driver circuit;
a diode coupled to the voltage supply; and
a load circuit coupled to the diode and configured to maintain a bias voltage of the bias voltage generator.

18. The signal driver circuit of claim 16 wherein the bias voltage generator comprises a voltage divider circuit and a diode coupled transistor.

19. A memory, comprising:
a voltage supply;
an array of memory cells arranged in rows and columns;
a command decoder operable to decode received command signals and to generate control signals corresponding to the command signals;
a data path coupled to the array of memory cells, the data path operable to couple read data from the array of memory cells and to couple write data to the array of memory cells; and
a signal driver circuit having an output node coupled to the data path and configured to drive an output signal on the data path having a logic level according to an input signal, the signal driver circuit comprising:

a signal driver configured to generate an output signal at the output node in response to the input signal;

a transistor coupled to the signal driver and configured to be coupled to the voltage supply, the transistor configured to couple and decouple the output node and the voltage supply according to a control signal; and a voltage comparator circuit coupled to the output node and the transistor and configured to receive a reference voltage, the voltage comparator circuit configured to generate the control signal to control coupling and decoupling of the output node and the voltage supply through the transistor based on a voltage of the output signal relative to the reference voltage.

20. The memory of claim 19 wherein the reference voltage is equal to a desired voltage for a high-logic level output signal.

21. The memory of claim 19 wherein the signal driver comprises first and second series coupled transistors and the transistor coupled to the signal driver comprises a transistor coupled between the voltage supply and the first transistor.

22. The memory of claim 19 wherein the signal driver comprises a complementary pair of transistors and the transistor coupled to the signal driver comprises a transistor coupled between the output node of the signal driver and a first transistor of the complementary pair, the first transistor further coupled to the voltage supply.

23. The memory of claim 19 wherein the voltage comparator circuit comprises a differential pair amplifier.

24. The memory of claim 23 wherein the differential pair amplifier comprises:
a load circuit coupled to the voltage supply;
a current mirror circuit having an input and an output;
a first transistor coupled to the load circuit and the input to the current mirror; and
a second transistor coupled to the load circuit and the output of the current mirror.

25. The memory of claim 19 wherein the voltage comparator circuit comprises a common-gate amplifier having an output coupled to an inverter circuit.

26. The memory of claim 25 wherein the common-gate amplifier comprises a load circuit coupled to the voltage supply and the output and a transistor coupled to the output node of the signal driver and the output of the common-gate amplifier.

27. A processor-based system comprising:
a processor;
an input device;
an output device; and
a memory coupled to the processor and configured to receive an input clock signal, the memory comprising:
a voltage supply;
an array of memory cells arranged in rows and columns;
a command decoder operable to decode received command signals and to generate control signals corresponding to the command signals;
a data path coupled to the array of memory cells, the data path operable to couple read data from the array of memory cells and to couple write data to the array of memory cells; and
a signal driver circuit having an output node coupled to the data path and configured to drive an output signal on the data path having a logic level according to an input signal, the signal driver circuit comprising:
a signal driver configured to generate an output signal at the output node in response to the input signal;
a transistor coupled to the signal driver and configured to be coupled to the voltage supply, the transistor configured to couple and decouple the output node and the voltage supply according to a control signal; and
a voltage comparator circuit coupled to the output node and the transistor and configured to receive a reference voltage, the voltage comparator circuit configured to generate the control signal to control coupling and decoupling of the output node and the voltage supply through the transistor based on a voltage of the output signal relative to the reference voltage.

28. A method of generating an output signal at an output node in accordance to an input signal, comprising:
coupling the output node to a supply voltage to generate an output signal at the output node having a high-logic level voltage in response to receiving an input signal having a first-logic level;
comparing a voltage of the output signal to a reference voltage on which the high-logic level voltage is at least based in part, the reference voltage less than the supply voltage; and
in response to the output signal being greater than the reference voltage and less than the supply voltage, controlling a transistor coupling the supply voltage to the output node to be non-conductive.

29. The method of claim 28 wherein comparing a voltage of the output signal to a reference voltage comprises comparing the voltage of the output signal to a voltage equal to the high-logic level voltage.

30. The method of claim 28 wherein controlling a transistor to be non-conductive comprises generating a control voltage having an inverse voltage relationship with the voltage of the output signal.

31. The method of claim 28 wherein generating an output signal at the output node having a high-logic level voltage in response to receiving an input signal having a first-logic level comprises controlling a p-channel transistor to be conductive.

32. The method of claim 28 wherein generating an output signal at the output node having a high-logic level voltage in response to receiving an input signal having a first-logic level comprises controlling an n-channel transistor to be conductive.

* * * * *